(12) United States Patent  
Kovesi et al.

(10) Patent No.: US 8,418,032 B2  
(45) Date of Patent: Apr. 9, 2013

(54) PROCESSING OF BIT ERRORS IN A DIGITAL AUDIO BIT FRAME

(75) Inventors: Balazs Kovesi, Lannion (FR); Stéphane Ragot, Lannion (FR)

(73) Assignee: France Telecom, Paris (FR)

( * ) Notice: Subject to any disclaimer, the term of this patent is extended or adjusted under 35 U.S.C. 154(b) by 0 days.

(21) Appl. No.: 12/744,993

(22) PCT Filed: Dec. 10, 2008

(86) PCT No.: PCT/FR2008/052259  
§ 371 (c)(1),  
(2), (4) Date: Jul. 9, 2010

(87) PCT Pub. No.: WO2009/080982  
PCT Pub. Date: Jul. 2, 2009

(65) Prior Publication Data  
US 2010/0306629 A1 Dec. 2, 2010

(30) Foreign Application Priority Data  
Dec. 10, 2007 (FR) ....................................... 07 59694

(51) Int. Cl.  
*H03M 13/00* (2006.01)

(52) U.S. Cl.  
USPC ............................ 714/774; 714/752; 714/790

(58) Field of Classification Search .................. 714/774, 714/752, 799, 748, 790, 722, 708, 738  
See application file for complete search history.

(56) References Cited

U.S. PATENT DOCUMENTS

| 4,771,463 | A | * | 9/1988 | Beeman | 380/46 |
| 5,519,719 | A | * | 5/1996 | Elpers et al. | 714/738 |
| 5,627,835 | A | * | 5/1997 | Witter | 370/320 |
| 6,141,781 | A | * | 10/2000 | Mueller | 714/722 |

* cited by examiner

*Primary Examiner* — Fritz Alphonse  
(74) *Attorney, Agent, or Firm* — Drinker Biddle & Reath LLP

(57) ABSTRACT

The invention relates to a method of processing bit errors in a bit frame emanating from a digital audio coder, comprising a step of receiving a current bit frame liable to comprise bit errors. According to the invention, the bit frame comprises sensitive bits to be protected which are catalogued in at least one category according to the type of parameter that they code and the method furthermore comprises the steps of receiving protection bits, of reading the sensitive bits received in the current bit frame, the number of sensitive bits being lower than the number of bits of the bit frame, of detecting bit errors as a function of said protection bits received and of said sensitive bits received and in the event of detecting at least one erroneous bit in said bit frame, of modifying the current bit frame before decoding, as a function of the category in which the erroneous bit is catalogued. The invention also pertains to a device implementing the method according to the invention as well as to a decoder and a coding/decoding system comprising such a device.

10 Claims, 4 Drawing Sheets

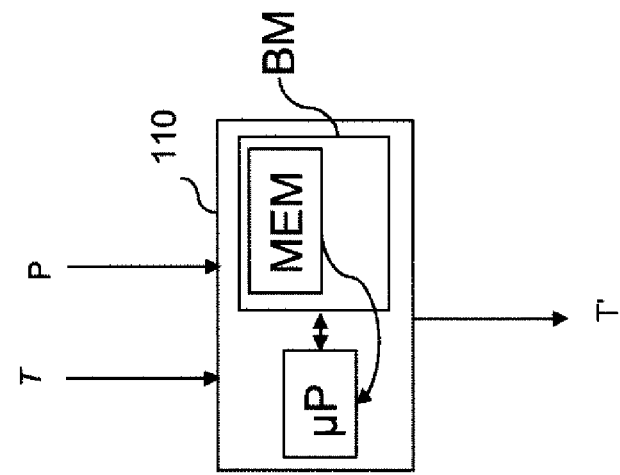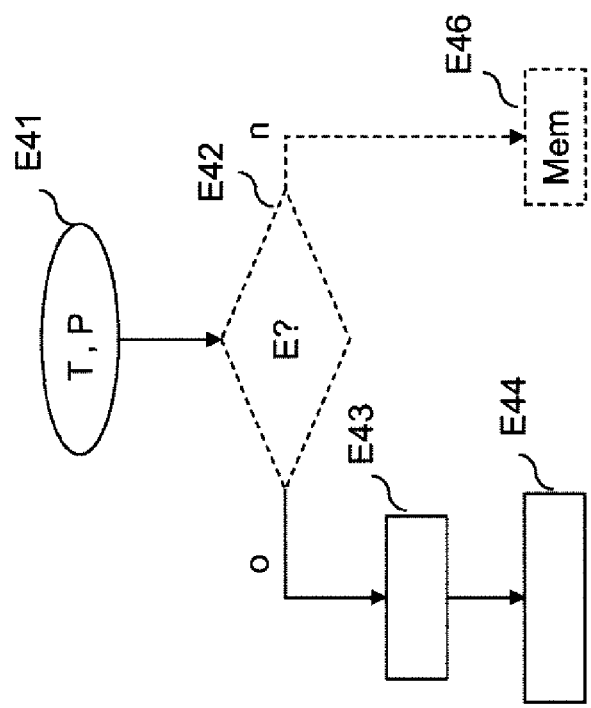

PROCESSING OF BIT ERRORS IN A DIGITAL AUDIO BIT FRAME

CROSS-REFERENCE TO RELATED APPLICATIONS

This application is the U.S. national phase of the International Patent Application No. PCT/FR2008/052259 filed Dec. 10, 2008, which claims the benefit of French Application No. 07 59694 filed Dec. 10, 2007, the entire content of which is incorporated herein by reference.

FIELD OF THE INVENTION

The present invention relates to the processing of digital signals in the field of telecommunications. These signals may be, for example, speech signals, music signals, video signals or, more generally, multimedia signals. More particularly, the invention aims to protect the coded data against bit errors and the processing of bit errors in a bit frame.

The invention applies more particularly to a hierarchical-type coding/decoding system.

BACKGROUND

There are various techniques for converting into digital form and compressing a digital audio signal. The most common techniques are:
- the wave-form coding methods, such as PCM (Pulse Code Modulation) and ADPCM (Adaptive Differential Pulse Code Modulation) coding,
- the analysis—and synthesis-based parametric coding methods such as CELP (Code Excited Linear Prediction) coding, and
- the methods of perceptual coding in subbands or by transform.

These techniques process the input signal sequentially, sample by sample (PCM or ADPCM), or in blocks of samples called "frames" (CELP and transform coding). For all these coders, the coded values are then multiplexed in a bit stream which is transmitted over a transmission channel.

Depending on the reliability and the type of transmission channel, disturbances may affect the transmitted signal and produce errors on the bit stream received by the decoder. These errors may occur in isolation in the bit stream or in bursts. This type of problem is encountered, for example, for transmissions over the mobile networks or over a wireless link of DECT (Digital Enhanced Cordless Telephone) type.

The consequence of an errored bit in the bit stream varies according to the coder used and also according to the type of parameter affected by the error. Obviously, the position (or weight) of the errored bit among the bits coding a parameter is also important. For example, for a scalar-type quantization, an error on the most significant bit MSB is more serious than an error on the least significant bit LSB.

In ITU-T standard G.711, each sample is represented on 8 bits by a PCM coding that uses an amplitude compression law in the form of a linear function by segments followed by a uniform scalar quantization. For each sample, G.711 generates 8 code bits which comprise 1 sign bit, 3 bits to identify the segment of the compression law and 4 bits to specify the location of a level on a given segment. An isolated error on the sign bit of a high amplitude sample causes a very clear discontinuity in the decoded signal, and listening quality is then highly degraded. Conversely, an isolated error on the least significant bit specifying the location of a level on a segment is practically inaudible. Since the quantization is of scalar type, the sensitivity with respect to bit errors increases with the position of the corrupted bits, the least sensitive bit being the least significant bit specifying the location of a level on a segment and the most sensitive bit being the most significant bit indicating a segment identifier. The sensitivity of the sign bit depends on the absolute value of the coded current sample.

Another example is given by CELP-type coding. In this case, the pitch parameter (or fundamental period) is very sensitive to bit errors. Generally, this parameter is coded by a scalar-type quantizer. Such is the case of ITU-T standard G.729, in which the signal is coded in frames of 10 ms divided into two subframes. The pitch $T_1$ in the first 5 ms subframe is coded in absolute mode on 8 bits; the pitch $T_2$ in the second 5 ms subframe is coded in relative mode in relation to $T_1$.

A bit error reversing the first bit of the index associated with $T_1$ can change the value of the pitch from $T_1=143$ to $T_1=61\frac{2}{3}$. Furthermore, $T_2$ will also be badly decoded because its value is necessarily in the vicinity of $T_1$ because of the relative coding. It can be seen, with this example, that a single errored bit can completely corrupt the decoding of a 10 ms frame. An error on a bit representing the index of the fixed CELP coding dictionary generally has far less impact and does not generate any audible degradation.

In a transform-based coder, such as, for example, the ITU-T G.722.1 standardized coder, or the proprietary TDAC coder from France Telecom (TDAC standing for Time Domain Aliasing Cancellation), the parameters are generally associated with two different information items: the spectral envelope and the "fine structure" of the spectrum (that is to say, the spectrum standardized by the spectral envelope). The short-term spectrum of the signal is typically divided into a certain number of subbands and the spectral envelope is defined as the RMS value of each of the subbands. This envelope is often coded by scalar quantization followed by a differential Huffman coding. Thus, the first quantization index is coded in absolute mode, and the other indices are coded in differential mode relative to the preceding subband. Because of the recursive nature of this envelope coding, a bit error in a given subband is propagated to the subsequent subbands until the end of the spectrum, and the decoded envelope therefore becomes "random" from the subband in which the error occurred. Furthermore, in certain variants in which the dynamic allocation of bits representing the fine structure of the spectrum depends on the decoded spectral envelope—which is the case with the G.722.1 and TDAC coders—the impact of the bit errors on the spectral envelope is also propagated to the decoding of the fine structure, which then becomes aberrant. The preceding examples show that the various bits of the bit stream generally require different protection levels and different strategies for concealing bit errors.

In the so-called "hierarchical" coding systems, also called "scalable", the bit data obtained from the coding operation is divided up into successive layers. A bottom layer, also called "core", is formed by the bit elements that are absolutely necessary to the decoding of the bit stream, and determining a minimum decoding quality. The subsequent layers are used to gradually enhance the quality of the signal obtained from the decoding operation, each new layer bringing new information which, when used by the decoder, supply a signal of increasing quality as output.

One of the particular features of the hierarchical coders-decoders is the possibility of intervening at any level of the transmission or storage chain to eliminate a portion of the bit stream without having to supply any particular indication to the coder or to the decoder. The decoder uses the bit information that it receives and produces a signal of corresponding quality.

The different layers of bit elements are generally hierarchically arranged (hence the name "hierarchical"), that is to say that if level 0 is called the core, then 1, 2, 3, etc. the subsequent layers, the decoding of the level 3 layer presupposes that the bit elements of the layers 0, 1 and 2 are also available.

The hierarchical coders are of particular interest in the contexts of transmission over networks with heterogeneous access: whether these are IP-type networks mixing fixed and mobile access, high bit rates (ADSL), low bit rates (56 k modems, GPRS) or involving terminals of variable capacities (cellphones, PC, etc.). The hierarchical coding makes it possible in practice to adapt the bit rate of a transmission without requiring transcoding. One example worth mentioning is access to audio content bases in which the audio samples are recorded with the highest bit rate of a hierarchical coder, the transmitted bit rate then being adapted to the capacity (or to the negotiated service quality) of the client being served. Another application is audio-video conferencing on heterogeneous access, in which the terminals that have high bit rate access can communicate at high bit rate even if one of the terminals in the conference does not have this capability, and do so without requiring transcoding.

The EV-VBR (Embedded Variable—Variable Bit Rate) coder currently being studied in the ITU-T question Q.9/16 (study period 2004-2008) is one example of a scalable speech coder. This coder has a bit stream structured in 5 layers associated with different bit rates (8, 12, 16, 24 and 32 kbits/s). A method of processing bit errors for EV-VBR is described in the RFC (Request For Comments) draft published on 12 Nov. 2007 by the IETF at the following web address: http://www.ietf.org/internet-drafts/draft-lakaniemi-avt-rpt-evbr-00.txt.

The payload format proposed in the above document consists of one or more transport blocks containing one or more layers, and the header of each transport block contains protection bits in the form of a CRC (Cyclic Redundancy Check) code for all the bits included in the corresponding transport block.

If an error is detected in a transport block that contains the layer Ln, only the lower layers (L1, . . . L(n−1)) will be decoded for the given frame. The detection of an errored bit in a transport block therefore leads to the same processing: rejection of the errored block and of the blocks above.

The probability of obtaining a decoding of all the layers of the frame is therefore very low with such a method, even with a low bit error rate.

Thus, in the case where each layer is sent in a different transport block, 5 8-bit CRC codes are transmitted in the payload which gives an additional bit rate of 2 kbit/s for a 20 ms frame. Even with a low bit error rate, the probability of being able to decode the maximum bit rate is low. For example, with a bit error rate of 0.1%, table 1 below gives the probability of being able to decode different configurations. This table also takes into account the bit errors on the CRC codes.

TABLE 1

| Layers decoded | Bit rate decoded | Probability |
| --- | --- | --- |
| Frame erased | 0 kbit/s | 15.5% |
| L1 | 8 kbit/s | 7.1% |
| L1 to L2 | 12 kbit/s | 6.5% |
| L1 to L3 | 16 kbit/s | 11.0% |
| L1 to L4 | 24 kbit/s | 9.3% |
| L1 to L5 | 32 kbit/s | 50.6% |

It can be seen that, even with a bit error rate BER as low as 0.1%, 15.5% of the frames will be considered invalid and a lost frame concealment algorithm will then be applied. With 15.5% of frames lost, the decoded quality will then be very mediocre.

In the case where all the layers are in one and the same transport block, the additional CRC code bit rate is only 0.4 kbit/s. However, with 0.1% bit error rate, close to half of the frames will be considered lost (49.4%). With 49.4% of frames lost, communication becomes impossible.

There is therefore a need to improve the quality of the decoded signal when there are bit errors. The present invention improves the situation.

SUMMARY

To this end, the invention targets a method of processing bit errors in a bit frame obtained from a digital audio coder, comprising a step for receiving a current bit frame likely to include bit errors. The method of the invention is such that the bit frame includes sensitive bits to be protected which are cataloged in at least one category according to the type of parameter that they code and in that it also comprises the following steps:
  reception of protection bits used for error detection on the sensitive bits to be protected;
  reading of the sensitive bits received in the current bit frame, the number of sensitive bits being less than the number of bits in the bit frame;
  detection of bit errors as a function of said received protection bits and of said received sensitive bits; and
  if at least one errored bit is detected in the bit frame, modification of the current bit frame before decoding, the modification being dependent on the category in which the errored bit is cataloged.

Thus, the processing to be applied if a bit error is detected in a bit frame is adapted to the errored bit. Different processing operations can then be implemented according to the classification of the sensitive bits to be protected, the classification depending on the type of parameter coded by these bits.

This therefore makes it possible to reduce the number of frames rejected if bit errors are detected, because only the sensitive bits of the bit stream are protected.

Since the detection of errored bits is applied only to some of the bits of the bit frame and not to all of a transport block as in the case of the state of the art, this also makes it possible to improve the probability of being able to decode all the layers of a hierarchical bit frame and therefore improve the quality of the decoded signal.

Furthermore, this processing is performed before the decoding operation proper. It can therefore be performed upstream of the decoder, by an independent entity for example. The decoder that receives a modified frame does not need to know if there have been bit errors and does not need to implement erased frame concealment methods.

It should be noted that there is no need here to place the most sensitive bits at the start of the bit frame as may be required, for example, to profit from the protection mode provided by the UDP-Lite (UDP standing for User Datagram Protocol) type transport protocol in packet networks of IP (Internet Protocol) type. In practice, the UDP-Lite protocol provides a CRC code that protects the bits situated at the start of a bit frame.

Thus, the invention makes it possible also to protect hierarchical frames in which the order of the bits is established by the hierarchical property, the most sensitive bits not then necessarily being at the start of the bit frame.

In a preferred embodiment, the protection bits are defined according to the category in which the sensitive bits to be protected are cataloged.

Thus, a protection method is adapted according to the parameters coded by the bits to be protected in order to better adapt the protection method to the signal.

In one possible embodiment, the modification of the current frame comprises the replacement of the bits of the same category as the errored bit detected with non-errored bits received and stored in a preceding frame.

Thus, it is possible, for example, to exploit the fact that some parameters have a slow variation such as, for example, the energy or the pitch (or fundamental period) in order to replace the errored bits with the stored bits from a preceding frame.

In one possible embodiment, since the bit frame consists of layers representing different coding bit rates, the modification of the current frame comprises a truncation of the bit frame, removing the bits corresponding to the layers of higher bit rate than that in which the detected errored bit is located and the layer including the errored bit.

Thus, in the case of a hierarchical frame, only the frame corresponding to a bit rate lower than that containing the errored bit is transmitted to the decoder. The decoder has no other processing operations to perform. Both the hierarchical aspect of the bit frame and the fact that the residual errors on the insensitive bits have little perceptual impact are exploited.

In a variant embodiment, the modification of the current frame also comprises a step for modifying an item of bit rate information in the header of the current bit frame.

The decoder is thus directly informed of the decoding bit rate that it has to apply.

In a particular embodiment, the bit frame is obtained from a hierarchical coder of G.729.1 standardized type in which the bits to be protected are cataloged in at least two categories, a first category comprising the bits coding the average energy of the top layer of the coder and a second category comprising the bits coding the parameters representing the transform (MDCT), and the protection bits corresponding to the first category are parity bits and the protection bits corresponding to the second category are redundancy bits.

In this case, if an errored bit belonging to the first category is detected, the modification of the current frame comprises the replacement of the bits of the first category with non-errored bits received in a preceding frame and, if an errored bit belonging to the second category is detected, the modification of the current frame comprises a truncation of the bit frame, removing the bits corresponding to the layers of higher bit rate than that in which the detected errored bit is located and the layer including the errored bit.

The present invention also targets a device for processing bit errors in a bit frame obtained from a digital audio coder, the bit frame being likely to include bit errors, such that the bit frame comprises sensitive bits to be protected which are cataloged in at least one category according to the type of parameter that they code. The device comprises:

a module for receiving protection bits that are useful for error detection on the sensitive bits to be protected and a current bit frame;

a module for reading the sensitive bits in the current bit frame;

a module for detecting bit errors according to said received protection bits and said sensitive bits of the received bit frame obtained from the reception module; and a module for modifying the bit frame before decoding is implemented if at least one errored bit is detected in the bit frame by the detection module, the modification being dependent on the category in which the errored bit is cataloged.

It also targets a system for coding/decoding a bit frame likely to include bit errors, comprising:

a coder able to code a digital audio signal in a bit frame.

The system is such that the bit frame comprises sensitive bits to be protected which are cataloged in at least one category according to the type of parameter that they code and that it also comprises:

a protection device able to determine protection bits suited to the bits to be protected according to the category in which the bits to be protected are cataloged;

a device for processing bit errors as described above; and a decoder able to decode the modified bit frame obtained from the bit error processing device as a digital audio signal.

It also targets, in a variant embodiment, a digital audio decoder comprising a bit error processing device described hereinabove.

The present invention finally targets a computer program comprising code instructions for implementing the steps of the method according to the invention, when these instructions are executed by a processor.

BRIEF DESCRIPTION OF THE DRAWINGS

Other advantages and features of the invention will become apparent on studying the detailed description, given as an example hereinbelow, and the appended drawings in which:

FIG. 4 illustrates the steps of the bit error processing method according to the invention; and FIG. 5 illustrates an exemplary embodiment of a bit error processing device according to the invention.

DETAILED DESCRIPTION

Figure 1:
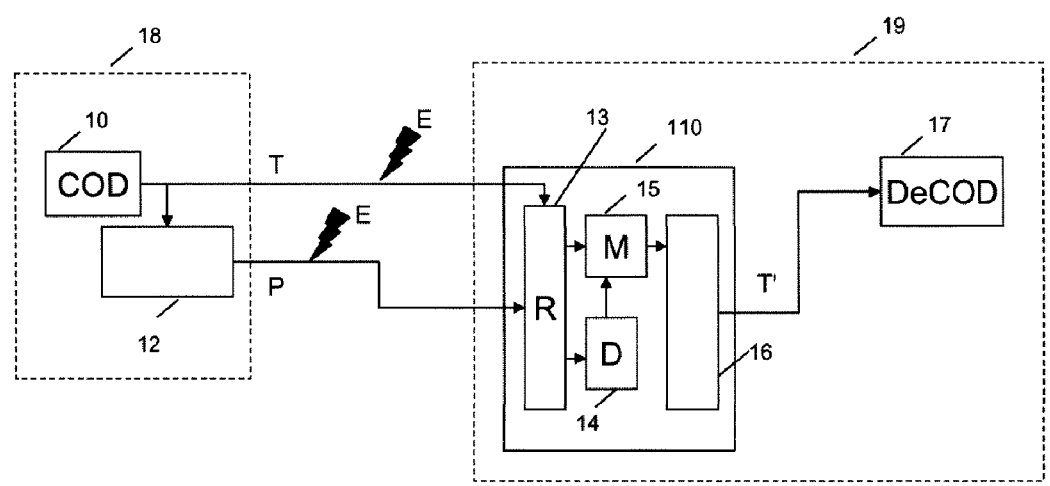
FIG. 1 illustrates a bit stream coding/decoding system comprising a bit error processing device according to the invention.

FIG. 1 illustrates a system in which a bit error processing device 110 is provided. This system comprises a coder 10 which delivers as output a bit stream T. A protection module 12 recovers the bit stream and reads the value of the sensitive bits to be protected in this bit stream. According to the parameters that they code, this protection device catalogs the sensitive bits to be protected in different categories. These categories are established according to the type of parameter coded, to differentiate the processing to be applied if errored bits are detected in one of the categories.

Protection bits P are then calculated on the bits to be protected that have been identified. The protection bits are determined according to a method that may differ according to the category in which the bits to be protected is cataloged. Thus, different protection levels can be provided depending on the classification of the bits to be protected.

These protection bits are then sent in parallel with the bit stream. They can be sent over the same noise-affected channel as that of the bit stream, for example by being concatenated in the payload of one and the same packet in an IP protocol communication context.

In another embodiment, the protection device can be incorporated in the coder 18 and the protection bits can be incorporated in the bit stream.

Depending on the quality of the transmission channel, disturbances may affect the transmitted signal and produce errors (E) on the bit stream received by the decoder. These errors may affect both the bit stream and the protection bits obtained from the protection device.

A bit error processing device 110 according to the invention is provided in the system represented. This device comprises a reception module R referenced 13 receiving both the bit stream T and the protection bits P.

The device 110 comprises a module D referenced 14 for detecting bit errors. This module checks whether the protection bits received correspond to those calculated locally on the bit stream. This module thus detects any bit errors on the sensitive bits.

If an error is detected, the module 16 modifies the bit stream so that the impact of this error on the quality of the signal is reduced. For this, the action of this module differs according to the type of parameter associated with the errored bit or bits detected and therefore the category in which the errored bit is cataloged.

Thus, the bit frame may be, for example, modified by replacing the errored bits with bits that have been stored in M referenced 15 in a preceding frame when the detection module has not detected bit errors.

Another way of modifying the bit frame may be, for example, truncating the bit stream in the current frame. For a hierarchical-type bit stream, this will correspond, for example, to rejecting the layers with a higher bit rate than that affected by the detected errored bit and the layer concerned. Thus, for a frame processed by the device according to the invention, the decoder will use a bit rate that is lower than that received.

The decoder 17 then receives a modified bit stream T'. Thus, the decoder decodes the modified bit stream without being informed of the modification. If the second processing operation described is applied to the bit stream, the decoder will decode the bit stream with a bit rate that is lower than that initially provided in the bit frame T.

In another embodiment, the bit error processing device may be incorporated in the decoder 19. The decoder then receives both the bit stream and the protection bits either separately or altogether.

The present invention advantageously applies to the case of a hierarchical audio coding and decoding system. In a particular embodiment of the invention, the coder 10 is a G.729.1 standardized type coder.

Figure 2:
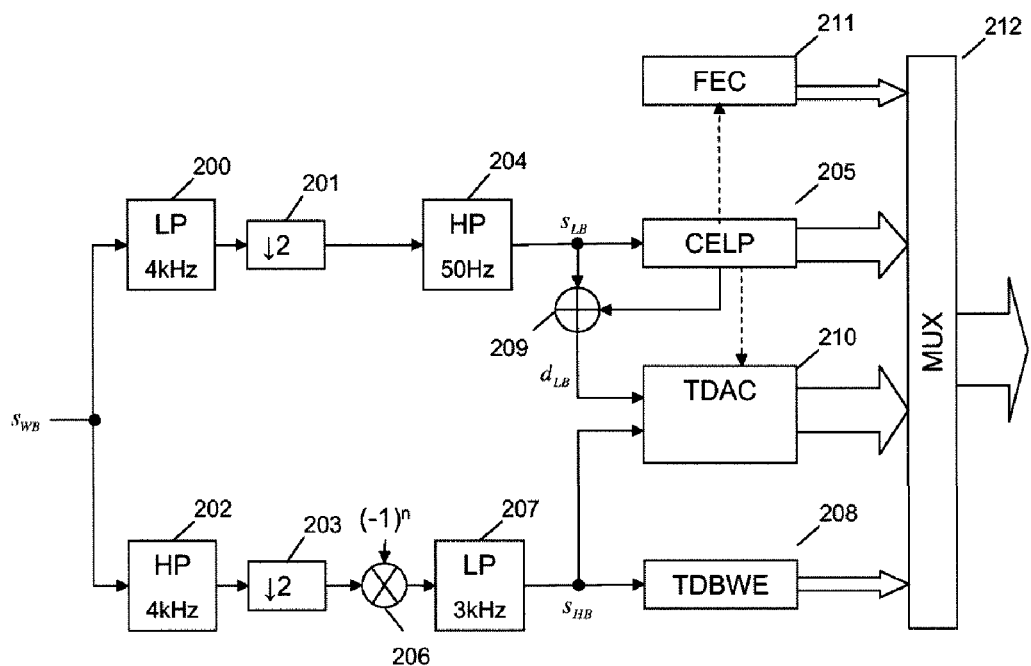
FIG. 2 illustrates a G.729.1 type coder delivering a hierarchical bit stream likely to be processed according to the bit error processing method of the invention.

FIG. 2 illustrates the main elements of a hierarchical coder of ITU-T standardized G.729.1 type.

This hierarchical coder has very fine scalability, the bit stream comprising 12 layers. The corresponding aggregate bit rates are 8, 12, 14, 16, 18, 20, 22, 24, 26, 28, 30 and 32 kbit/s.

The G.729.1 coder is an extension of the ITU-T G.729 standardized coder. It is a hierarchical coder with a modified G.729 core, producing a signal with a bandwidth ranging from narrow band (50-4000 Hz) to wide band (50-7000 Hz) at a bit rate of 8 to 32 kbit/s for conversational services. This standard was created in particular for voice-over-IP (Internet Protocol) type network applications that use the UDP (User Datagram Protocol).

This coder naturally interworks with recommendation G.729, which ensures compatibility with the existing voice-over-IP equipment (most comprising G.729 equipment).

The wide band mode input signal $s_{wb}$, sampled at 16 kHz, is first broken down into 2 subbands by QMF (Quadrature Mirror Filter) filtering. The low band (0-4000 Hz) is obtained by low-pass filtering LP (block 200) and decimation (block 201), and the high band (4000-8000 Hz) by high-pass filtering HP (block 202) and decimation (block 203). The LP and HP filters have a length of 64.

The low band is preprocessed by a high-pass filter that eliminates the components below 50 Hz (block 204), to obtain the signal $s_{LB}$, before narrow-band CELP coding (block 205) at 8 and 12 kbit/s. This high-pass filtering takes account of the fact that the wide band is defined as covering the 50-7000 Hz range. The narrow-band CELP coding is a cascaded CELP coding comprising, for the first stage, modified G.729 coding without preprocessing filter and, for the second stage, an additional fixed CELP dictionary.

The high band is first preprocessed (block 206) to compensate for the aliasing due to the high-pass filter (block 202) combined with the decimation (block 203). The high band is then filtered by a low-pass filter (block 207) to eliminate the components between 3000 and 4000 Hz from the high band (that is to say, the components between 7000 and 8000 Hz in the original signal) to obtain the signal $S_{HB}$. A band extension (block 208) is then applied. The low band error signal $d_{LB}$ is calculated (block 209) from the output of the CELP coder (block 205) and a transform-based predictive coding (for example of TDAC—Time Domain Aliasing Cancellation—type, block 210) is applied. Additional parameters are transmitted by the block 211 to a peer decoder via the FEC (Frame Erasure Concealment) module in order to reconstruct any erased frames.

The G.729.1 codec therefore has a three-stage coding architecture comprising:
- a cascaded CELP coding;
- a parametric band extension by TDBWE (Time Domain Bandwidth Extension), and
- a predictive coding by TDAC transform applied after an MDCT (Modified Discrete Cosine Transform) type transformation.

The different bit streams generated by the coding blocks 205, 208, 210 and 211 are multiplexed and structured as a hierarchical bit stream in the multiplexing block 212. Coding is implemented by sampling blocks (or frames) of 20 ms, or 320 samples per frame.

Thus, at the maximum bit rate of 32 kbit/s, the bit budget per frame is 640 bits. As specified in standard G.729.1, the core layer comprises the G.729 parameters; the corresponding bits are located in positions 0-159.

The second layer (bits 160-239) comprises the additional cascaded CELP coding parameters and bits used to conceal erased frames (FEC). The higher layers comprise FEC bits and the parameters of the TDBWE and TDAC coders. In particular, for the TDBWE coder, three types of parameters are differentiated:
- the average time envelope (MU) which is linked to the energy of the high-band signal in the current frame (bits 240-244);
- the vector quantization indices of the time envelope (bits 245-258); and
- the vector quantization indices of the frequency envelope (bits 259-272).

For the TDAC coder, four types of parameters are differentiated:

an overall MDCT standardization factor (N) (bits 285-288);

the high band spectral envelope (RMS2, variable bit rate, max 41 bits);

the low band spectral envelope (RMS1, variable bit rate, max 51 bits); and the vector quantization indices coding the fine structure.

This G729.1-standardized coding/decoding system was designed and optimized for communications over fixed links (non-mobile); it is therefore not very robust to bit errors and the quality of the signal rapidly degrades with any increase in the bit error rate.

Thus, the invention improves the quality of the decoded signal in the presence of bit errors by the bit error processing method described with reference to FIG. 4 and implemented by the bit error processing device described with reference to FIG. 1.

Also, in this same particular embodiment of the invention, the decoder 17 is a G.729.1 standardized type decoder.

Figure 3:
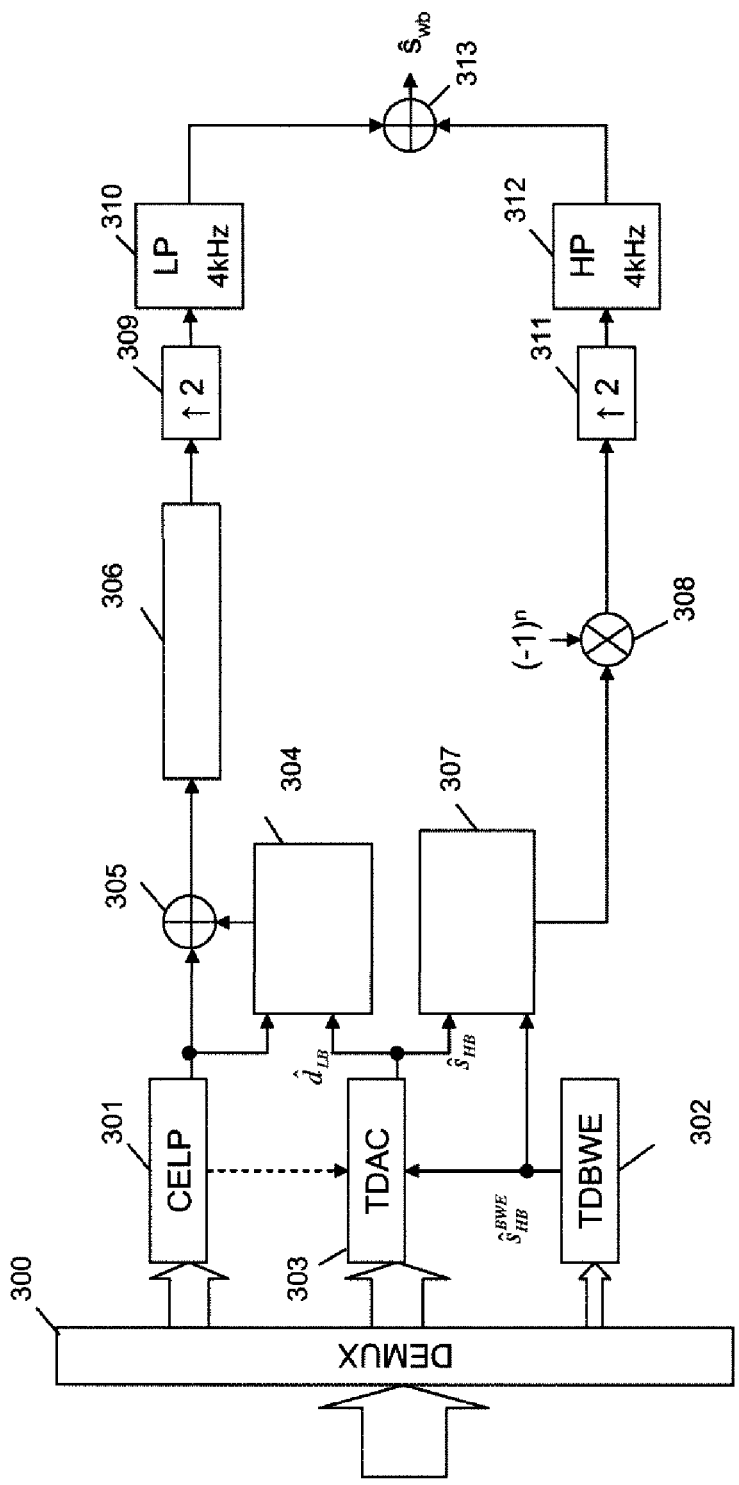
FIG. 3 illustrates a G.729.1 type decoder likely to receive a hierarchical bit stream modified according to the bit error processing method of the invention.

FIG. 3 describes such a decoder.

The bits describing each 20 ms frame are demultiplexed in the block 300. The bit stream from the 8 and 12 kbit/s layers is used by the CELP decoder (block 301) to generate the narrow band synthesis (0-4000 Hz). The portion of the bit stream associated with the 14 kbit/s layer is decoded by the band extension module (block 302). The portion of the bit stream associated with the bit rates above 14 kbit/s is decoded by the TDAC module (block 303). Pre- and post-echo processing is applied by the blocks 304 and 307, as is an enriching (block 305) and a post-processing of the low band (block 306). The wide band output signal ŝ$_{wb}$, sampled at 16 kHz, is obtained via the synthesis QMF filter bank (blocks 309, 310, 311, 312 and 313) incorporating reverse aliasing (block 308).

When the present invention is applied for a G.729.1 bit stream, the protection device referenced 12 in FIG. 1 determines, firstly, the most sensitive bits of the bit stream.

The 8 kbit/s core layer follows the G.729 format. This format is considered to be fairly insensitive to bit errors.

In practice, in the case of the G.729-standardized coder, the protection of the most sensitive bits is incorporated in the bit stream. A parity bit is calculated on the 6 most significant bits (MSB) of the index giving the absolute coding of the pitch (or fundamental period) $T_1$ of the first 5 ms subframe. This parity bit is part of the bit stream.

For the second 5 ms subframe, the pitch $T_2$ is encoded in relative mode, in the vicinity of the value of the pitch of the first subframe $T_1$. $T_1$ for the values <86 and $T_2$ have a resolution of ⅓. The decoder calculates the parity of the 6 most significant bits of the index received for the parameter $T_1$ and, if the latter does not correspond to the value of the received parity bit, a concealment procedure is applied: all of the pitch $T_2$ of the preceding frame is used in place of the errored value for $T_1$ of the current frame.

Other precautions have also been taken to make the G.729 coders/decoders robust to bit errors. For example, the LPC (Linear Predictive Coding) envelope is quantized in the spectral ray pairs domain (LSF) by multiple-stage quantization. Furthermore, the gains of the CELP dictionaries are coded by conjugate structure quantization which is intrinsically robust to bit errors and ensures that, in the event of an error, the decoded values are close to the values sent, which limits the impact of a bit error on the perceived quality.

The additional layer of the G.729.1 coder bringing the bit rate to 12 kbit/s is also fairly insensitive to bit errors because it simply enriches the excitation of the G.729 coder by adding a fixed dictionary, the parameters of which are fairly insensitive to bit errors.

For the parameters associated with the TDBWE and TDAC coders described previously, a certain number of sensitive bits are identified in the layers bringing a bit rate of 14, 16 and 18 kbit/s.

5 bits (positions 240 to 244 of the bit stream) representing the energy of the high band of the TDBWE coder and at most 56 bits (positions 285 to 340 of the bit stream) representing the standardization factor of the MDCT transform (4 bits) and the spectral envelope of the MDCT transform layer (variable number of bits per frame of between 48 and 82 bits) are thus determined as sensitive bits.

With the spectral envelope being coded by variable length codes, between 44 and 92 bits are needed to code the spectral envelope of the TDAC coder. However, always protecting 92 bits, which corresponds to the worst case, is not a good choice because this case occurs very rarely and, on average, fewer bits are consumed to describe the spectral envelope, and, more often than not, bits that do not need protection would be protected. It has been determined empirically that protecting 56 bits give a satisfactory result. Obviously, close values (for example 50, 51, 52, 54, 56, 59, 62, etc.) may be envisaged and will give very similar results.

In the higher layers, a bit error on the bits representing the fine structure of the spectrum is generally well tolerated.

Thus, in a particular embodiment of the invention, the duly identified most sensitive bits are classified in different categories according to the parameters that they code and the action recommended in reception upon detecting an error on one of the duly classified bits.

Thus, the 5 bits that code, in the TDBWE coding stage, the average energy of the high band are protected by a parity bit. If the parity is checked in the bit error processing device according to the invention represented in FIG. 1, the device 110 transmits these 5 bits to the decoder 17 without modifying the bit stream. It also stores, in 15, these 5 bits for possible subsequent processing.

If a bit error is detected in the detection module 14, the 5 bits received are replaced by the 5 bits stored from a preceding frame, in the module for modifying the bit frame 16. The device 110 then supplies the decoder 17 with a modified bit frame T'.

For this group of sensitive bits, the action is not therefore to reject the layer concerned (14 kbit/s layer) and all the higher layers, but to replace the errored bits with the stored bits. Since the average energy of the high-band signal changes slowly for most of the time, this solution gives a good result. This group of sensitive bits is thus cataloged in a first category for which the processing described above is applied if an errored bit of this category is detected.

The 56 sensitive bits of the TDAC layer (MDCT standardization factor+spectral envelope) are, according to the invention, protected by a 7-bit CRC (Cyclic Redundancy Check) code. This CRC code can obviously be of different length depending on the desired protection level. A 4-bit CRC code can, for example, be envisaged.

It is possible, for example, to use the generating polynomial $0Xb7=D^8+D^6+D^5+D^3+D^2+D+1$ as described in the article "Cyclic Redundancy Code (CRC) Polynomial Selection for Embedded Networks" by P. Koopman and T. Chakravarty, The Int. Conf on Dependable Systems and Networks (DSN), 2004. All the 1-, 2-, 3-, 5- and 7-bit errors, and more than 98% of the 4- and 6-bit errors can be detected with this polynomial.

The 56 sensitive bits thus belong to a second category for which, if one or more errors are detected in the bits of this category, the hierarchical property of the G.729.1 bit stream is used by applying a truncation. Thus, the device 110 according to the invention supplies the decoder 17 with a modified frame, corresponding to a frame of a 14 kbit/s bit rate.

As mentioned previously, a bit error in the spectral envelope of the TDAC coefficients is propagated to the end of the spectrum. This bit error also provokes an erroneous bit allocation for the representation of the fine structure. To avoid this, the processing to be applied is therefore a rejection of all the bit stream associated with the TDAC coder. For the frames concerned, the output will be that obtained by decoding the bit stream at 14 kbit/s.

The number of protection bits calculated in the protection device 12 is therefore 1+7=8 protection bits for each 20 ms frame. This increases the bit rate by 0.4 kbit/s. If the decoder receives only the 8 and 12 kbit/s layers, no protection is applied. If it also receives the 14 kbit/s layer, the parity bit is checked in the device 110 on the 5 bits of the energy of the received bit frame.

If the received bit rate is 16 kbit/s, there is no means of checking whether the layer with a bit rate of 16 kbit/s is error-free because the 7-bit CRC code is calculated jointly over the bits of the 16 and 18 kbit/s layers. Thus, in the channels in which there is a risk of having bit errors, it is better not to use the 16 kbit/s bit rate.

From 18 kbit/s, the validity of the spectral envelope of the TDAC layer can be checked.

Thus, in this embodiment, the protection device 12 calculates the 8 protection bits from the encoding side for each 20 ms frame from the G.729.1 bit stream T. The 8 bits (parity bit+7-bit CRC) obtained that form the protection bits P are sent to the processing device 110 of the invention.

These protection bits can be sent over the same noise-affected channel (in the same packet) as that of the bit stream, or over another channel.

The bit error processing device according to the invention receives both the bit frame T and the 8 protection bits. The detection module D recalculates the 8 redundancy bits on the received bit frame and compares them with the 8 protection bits received.

If the parity bit on the 5 bits of the energy of the 14 kbit/s layer is correct, the 5 bits are stored in memory 15. Otherwise, the module for modifying the bit frame replaces the 5 errored bits with the 5 bits stored previously in the bit frame. The G.729.1 decoder 17 will not be informed of this change; it decodes the modified bit frame T' as a valid frame.

If the detection module 14 of the device 110 detects an errored bit according to the 7-bit CRC code received and the corresponding bits in the bit frame received, the error then corresponds to an error in the TDAC spectral envelope. The module for modifying the bit stream then eliminates all the bits corresponding to the TDAC coding stage. The duly modified bit frame T' is then transmitted to the decoder 17.

In the case where the detection module detects both errored bits of the first category and errored bits of the second category, the bit frame is modified both by replacing the errored bits of the first category with non-errored bits stored from a preceding frame and by truncation of the bit frame by removal of the bits corresponding to the layers with bit rates higher than that in which the detected errored bit of the second category is located as well as the layer containing the errored bit.

Other types of processing may be envisaged for a G.729.1 type bit stream. The bit stream can, for example, be modified by "stealing" a bit from the 14 kbit/s layer (FEC pitch LSB bit) and 7 bits from the 16 kbit/s layer (to be removed from the TDAC coder's bit budget)—note, too, that the bits of the MDCT standardization factor could be used for calculating an estimate of this factor as in the G.722.1 standard, which amounts to stealing only 3 bits. It is also possible to use a 4-bit CRC code and use only the position of standardization factor bits, without stealing additional bits.

Depending on the system used, the G.729.1 decoder may obtain the information concerning the bit rate to be decoded either from the number of bits received or from a header containing this information. In this second case, when an error is detected in the TDAC layers, the module for modifying the bit frame 16 also modifies the header to indicate to the decoder that the bit rate to be decoded for the given frame is 14 kbit/s. Even in this case, the decoder 17 is not informed of the presence of a processing device 110. Only the change of bit rate is indicated to it. The change of bit rate may be provoked by any other transmission element other than bit errors.

Thus, there is no need to modify the existing G.729.1 coders or decoders to implement the invention. All that is needed is to add a protection device 12 as described previously and a bit error processing device 110 as described hereinabove to the path between the G.729.1 coder and the G.729.1 decoder in a coding/decoding system.

Table 2 below shows the same type of statistics as those given in relation to the bit error processing method described in the state of the art document cited, but this time with the method of the invention applied to a G.729.1 system.

TABLE 2

| Layers decoded | Bit rate decoded | Probability |
|---|---|---|
| Frame erased | 0 kbit/s | 0% |
| L1-L3 | 14 kbit/s | 5.4% |
| L1-L12 | 32 kbit/s | 94.5% |

It can be seen that, at the same 32 kbit/s bit rate and that at the same bit error rate (BER=0.1%), the probability of decoding the different layers is increased. The lost frames rate is 0%, which increases the quality of the decoded signal.

This particular embodiment described here offers reduced complexity for the bit error protection and processing devices. This complexity can be measured by using the library STL2005 from ITU-T standard G.191 annex A. The applicant has observed that the worst case of complexity observed was 0.063 WMOPS (Weighted Million Operations Per Second) for the protection device and 0.067 WMOPS for the bit error processing device.

In the example described, the protection device 12 and the bit error processing device 110 are outside the coder 10 and the decoder 17 and the protection bits are not included in the bit stream. In a variant embodiment, these modules can be incorporated in the coder and decoder from the coding/decoding system design stage, and the protection bits can then form part of the bit stream.

FIG. 4 gives a general illustration of the main steps of the bit error processing method according to the invention.

These steps are implemented by the processing device 110 described with reference to FIG. 1.

The step E41 is a step for receiving both a bit frame and protection bits. The bit frame comprises bits to be protected cataloged in at least one category according to the parameters that they code. The protection bits are calculated for the bits to be protected of the bit frame and according to their category.

It should be noted that the protection bits are used only for the detection of errors on the sensitive bits. They do not include information that can be used to modify the current frame after errors have been detected.

The step E42 consists in reading the sensitive bits received in the current bit frame and in detecting the bit errors in the received bit frame according to the protection bits received and the sensitive bits received.

The number of sensitive bits is less than the number of bits in the bit frame.

If bit errors are not detected (step E42 negative), a step (E46) for storing the corresponding bits of the bit frame can be carried out, according to the protection method applied to the bits to be protected.

If bit errors are detected in the step E42, a step E43 for modifying the received bit frame is carried out. This modification is carried out according to the category in which the errored bit is cataloged.

A step (E44) for transmitting the modified frame to the decoder is then carried out.

The duly processed bit frame is modified and not wholly lost.

FIG. 5 describes a particular embodiment of the bit error processing device according to the invention. Physically, this device 110 typically comprises a processor μP cooperating with a memory block BM including a storage memory and/or working memory, and the abovementioned memory MEM as means for storing bits that do not include bit errors. The memory block can advantageously include a computer program comprising code instructions for implementing the steps of the method according to the invention, when these instructions are executed by a processor μP of the device 110 and, in particular, a first step for reception of a bit frame comprising bits to be protected cataloged in at least one category according to the parameters that they code and protection bits, a second step for reading the sensitive bits received in the current bit frame, a third step for detecting bit errors according to the protection bits and the sensitive bits received, and a fourth step carried out if at least one errored bit is detected in the bit frame for modifying the bit frame according to the category in which the detected errored bit is cataloged.

Typically, FIG. 4 is a possible illustration of a flow diagram representing the algorithm of such a computer program.

The computer program may also be stored on a memory medium that can be read by a reader of the device or that can be downloaded into the memory space of the device 110.

This device 110 according to the invention may be independent or incorporated in a digital audio signal decoder such as a hierarchical decoder of G.729.1 type for example.

The present invention has been described with two possible types of processing operation following the detection of a bit error. It is quite possible to carry out other processing operations according to the category in which the detected errored bit is cataloged. It is possible, for example, to perform a processing operation consisting in decoding and storing the parameters correctly received and, if an error is detected on the bits of this parameter, predicting its value according to the stored values, coding this predicted value and replacing the errored bits with the duly obtained bits.

Because of this, the sensitive bits to be protected can be classified in more than two categories.

Similarly, the present invention can be applied to other types of scalable coders than that described in the particular embodiment.

The invention can in fact be applied to the case of hierarchical frames obtained from an EV-VBR type coder. The sensitive bits of this bit stream are then different from those described for the G.729.1 bit frame, because the coded parameters are obtained from a different coding model. The sensitive bits in EV-VBR can be identified on statistical and/or experimental bases.

The coder selected to serve as a basis for the development of the EV-VBR standard is described in the ITU-T document WP3/16, entitled "Extended High-level description of the Nokia/VoiceAge candidate for EV-VBR Codec", April 2007 (Source: Nokia, VoiceAge Corp.). Thus, in the case of an EV-VBR frame, it is possible, for example, to differentiate the bits coding the MDCT gains from those coding the MDCT coefficients proper, and applying, in the first case, a processing operation of the type involving replacement with stored bits and, in the second case, a processing operation of the type involving truncation of the bit frame.

The number of sensitive bits to be protected varies from one coder to another as does the calculation of the appropriate protection bits. The invention applies to all these cases.

The invention claimed is:

1. A method of processing bit errors in a bit frame obtained from a digital audio coder, comprising a step for receiving a current bit frame likely to include bit errors, wherein the bit frame comprises sensitive bits to be protected which are catalogued in at least one category according to the type of parameter that they code and in that the method also comprises the following steps:
   reception of protection bits used for error detection on the sensitive bits to be protected;
   reading of the sensitive bits received in the current bit frame, the number of sensitive bits being less than the number of bits in the bit frame;
   detection of bit errors as a function of said received protection bits and of said received sensitive bits; and
   if at least one error bit is detected in the bit frame, modification of the current bit frame before decoding, the modification being dependent on the category in which the error bit is catalogued.

2. The method as claimed in claim 1, wherein the protection bits are defined according to the category in which the sensitive bits to be protected are catalogued.

3. The method as claimed in claim 1, wherein the modification of the current frame comprises the replacement of the bits of the same category as the error bit detected with non-error bits received and stored in a preceding frame.

4. The method as claimed in claim 1, wherein, since the bit frame consists of layers representing different coding bit rates, the modification of the current frame comprises a truncation of the bit frame, removing the bits corresponding to the layers of higher bit rate than that in which the detected error bit is located and the layer including the error bit.

5. The method as claimed in claim 4, wherein the modification of the current frame also comprises a step for modifying an item of bit rate information in the header of the current bit frame.

6. The method as claimed in claim 1, wherein the bit frame is obtained from a hierarchical coder of G.729.1 standardized type in which the bits to be protected are catalogued in at least two categories, a first category comprising the bits coding the average energy of the top layer of the coder and a second category comprising the bits coding the parameters representing the transform, and in that the protection bits corresponding to the first category are parity bits and the protection bits corresponding to the second category are redundancy bits.

7. The method as claimed in claim 6, wherein, if an error bit belonging to the first category is detected, the modification of the current frame comprises the replacement of the bits of the first category with non-error bits received in a preceding frame and in that, if an error bit belonging to the second category is detected, the modification of the current frame comprises a truncation of the bit frame, removing the bits corresponding to the layers of higher bit rate than that in which the detected error bit is located and the layer including the error bit.

8. A device for processing bit errors in a bit frame obtained from a digital audio coder, the bit frame being likely to include bit errors, wherein the bit frame comprises sensitive bits to be protected which are catalogued in at least one category according to the type of parameter that they code and in that the device comprises:
- a module for receiving protection bits that are useful for error detection on the sensitive bits to be protected and a current bit frame;
- a module for reading the sensitive bits in the current bit frame;
- a module for detecting bit errors according to said received protection bits and said sensitive bits of the received bit frame obtained from the reception module; and
- a module for modifying the bit frame before decoding is implemented if at least one error bit is detected in the bit frame by the detection module, the modification being dependent on the category in which the error bit is catalogued.

9. A digital audio decoder comprising a bit error processing device as claimed in claim 8.

10. A computer program stored on a non-transitory computer-readable medium and comprising program instructions for implementing the steps of the method according to claim 1, when said program is executed by a computer.

* * * * *